(12) United States Patent
Sandoval et al.

(10) Patent No.: US 11,894,485 B2
(45) Date of Patent: Feb. 6, 2024

(54) SOLAR CELL WAFER WIRE BONDING METHOD

(71) Applicant: Maxeon Solar Pte. Ltd, Singapore (SG)

(72) Inventors: Vergil R. Sandoval, Calamba (PH); Emmanuel C. Abas, Laguna (PH); Yafu Lin, San Jose, CA (US)

(73) Assignee: Maxeon Solar Pte. Ltd, Singapore (SG)

( * ) Notice: Subject to any disclaimer, the term of this patent is extended or adjusted under 35 U.S.C. 154(b) by 221 days.

(21) Appl. No.: 17/487,623

(22) Filed: Sep. 28, 2021

(65) Prior Publication Data

US 2022/0190190 A1 Jun. 16, 2022

Related U.S. Application Data

(60) Provisional application No. 63/124,970, filed on Dec. 14, 2020.

(51) Int. Cl.
*H01L 31/18* (2006.01)
*H01B 13/00* (2006.01)
*H01L 31/05* (2014.01)

(52) U.S. Cl.
CPC ....... *H01L 31/188* (2013.01); *H01B 13/0003* (2013.01); *H01L 31/05* (2013.01); *Y10T 29/49117* (2015.01)

(58) Field of Classification Search
CPC . H01B 13/0003; H01L 31/05; H01L 31/0504; H01L 31/022433; H01L 31/02013; H01L 31/02008; H01L 31/0201; H01L 31/035281; H01L 31/042; H01L 31/0516; H01L 31/188
USPC .................. 29/825, 729, 829, 835, 846, 850
See application file for complete search history.

(56) References Cited

U.S. PATENT DOCUMENTS

| | | | |
|---|---|---|---|
| 10,090,430 B2 * | 10/2018 | Morad | .............. H01L 31/02008 |
| 2014/0124014 A1 * | 5/2014 | Morad | ................. H01L 31/042 136/246 |

* cited by examiner

*Primary Examiner* — Thiem D Phan
(74) *Attorney, Agent, or Firm* — Schmidt Patent Law, Inc.

(57) ABSTRACT

A wire bonding system attaches wires to a solar cell wafer. The wire bonding system includes a feed tube through which a wire is drawn. Rollers contact the wire through openings in the feed tube to facilitate movement of the wire. The wire bonding system includes a soldering heater tip and a wire cutter. The solar cell wafer is placed on a platform, which moves the solar cell wafer. The system has multiple lanes for attaching multiple wires to the solar cell wafer at the same time in parallel operations.

7 Claims, 14 Drawing Sheets

SOLAR CELL WAFER WIRE BONDING METHOD

CROSS-REFERENCE TO RELATED APPLICATION

This application claims the benefit of U.S. Provisional Application No. 63/124,970, filed on Dec. 14, 2020, which is incorporated herein by reference in its entirety.

TECHNICAL FIELD

Embodiments of the subject matter described herein relate generally to solar cell fabrication systems and methods.

BACKGROUND

Solar cells are well known devices for converting light to electrical energy. A solar cell has a front side that faces the sun during normal operation to collect solar radiation and a back side opposite the front side. Solar radiation received by the solar cell creates electrical charges that may be harnessed to power an external electrical circuit, such as a load.

Solar cells may be fabricated from a silicon wafer. For example, a solar cell wafer may be doped, metallized, cleaved, etc. to yield a plurality of solar cells. Individual solar cells may be electrically connected and laminated with other components, such as glass, encapsulant, backsheet, etc., to form a solar module.

Despite their widespread acceptance, solar cells still need to be fabricated at low cost and high throughput to be able to commercially compete with other sources of energy. Embodiments of the present invention pertain to a system and method for attaching wires to solar cells.

BRIEF SUMMARY

In one embodiment, a wire bonding system is configured to attach wires to a solar cell wafer. The wire bonding system may include a moveable platform, a heated feed tube, a soldering heater tip, and a wire cutter. The platform supports and moves the solar cell wafer. A wire to be attached to the solar cell wafer comes from a wire source and is drawn through the feed tube. Rollers contact the wire through openings in the feed tube to facilitate at least the initial movement of the wire. The soldering heater tip contacts the wire to solder the wire to the solar cell wafer, and the wire cutter cuts the wire to a predetermined length. The system has multiple lanes for attaching multiple wires to the solar cell wafer in parallel operations.

In another embodiment, a method of attaching wires to a solar cell wafer includes soldering a first portion of each of a first plurality of wires on a solar cell wafer. In a first indexing instance, the solar cell wafer is moved to draw the first plurality of wires across the solar cell wafer. After moving the solar cell wafer in the first indexing instance, a second portion of each of the first plurality of wires is soldered on the solar cell wafer. Each of the first plurality of wires is then cut. In a second indexing instance, the solar cell wafer is moved to create a gap between the first plurality of wires and a following second plurality of wires on the solar cell wafer. In a following soldering step, the first plurality of wires may be soldered on the solar cell wafer along lengths of the first plurality of wires.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of systems, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
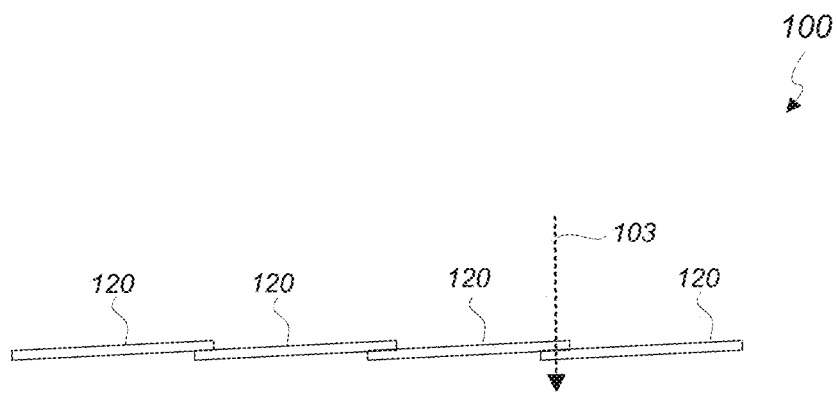
FIG. 1 shows a hypercell in accordance with an embodiment of the present invention.

FIG. 1 shows a hypercell 100 in accordance with an embodiment of the present invention. In the example of FIG. 1, the hypercell 100 comprises a plurality of solar cells 120 that are in a shingled arrangement, one overlapping another (see arrow 103) like shingled tiles on a roof. The shingled arrangement connects the solar cells 120 in series to form the hypercell 100. Each solar cell 120 has a semiconductor diode structure and electrical contacts to the semiconductor diode structure by which electric current generated in the solar cells 120, when they are illuminated by light, may be provided to an external load.

In one embodiment, each solar cell 120 is a crystalline silicon solar cell having a front side (sun side) with front surface metallization patterns and a back side having back surface metallization patterns. The front surface and back surface metallization patterns provide electrical contact to opposite sides of an n-p junction of the solar cell 120. The front surface metallization pattern is disposed on a semiconductor layer of n-type conductivity, and the back surface metallization pattern is disposed on a semiconductor layer of p-type conductivity. As can be appreciated, one or more aspects of the solar cells 120 may be varied without detracting from the merits of the present invention. For example, the front surface metallization pattern may be disposed on a semiconductor layer of p-type conductivity, and the back surface metallization pattern may be disposed on a semiconductor layer of n-type conductivity.

Figure 2:
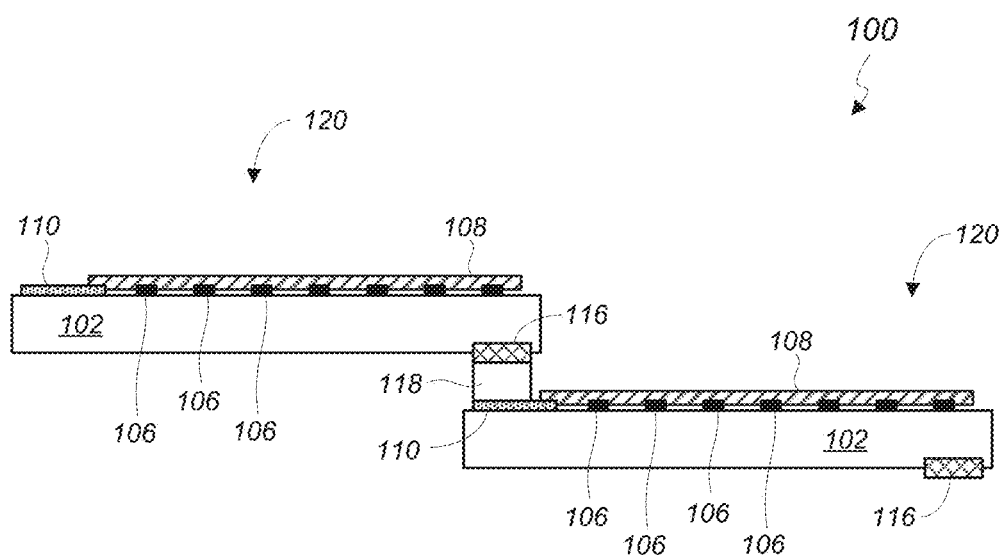
FIG. 2 shows an enlarged side cross-sectional view of an interface between overlapping solar cells in accordance with an embodiment of the present invention.

FIG. 2 shows an enlarged cross-sectional view of an interface (see FIG. 1, 103) between overlapping solar cells 120 in accordance with an embodiment of the present invention. A solar cell 120 may include a semiconductor substrate 102, a bus bar 110, fingers 106, and wires 108. The semiconductor substrate 102 may comprise a semiconductor layer of n-type conductivity on the front side and a semiconductor layer of p-type conductivity on the back side. Free electrons in the semiconductor layer 102 move from the semiconductor layer 102 through the fingers 106, to the wires 108, then to the bus bar 110. From the bus bar 110, the electrons may move to an adjacent connected solar cell 120, thus creating current through the hypercell 100.

In one embodiment, the front surface metallization patterns including the bus bar 110 and/or fingers 106 are formed from silver paste used for such purposes and deposited, for example, by screen printing methods. As can be appreciated, the bus bar 110 and/or fingers 106 may also be formed from other suitable materials and deposition methods. In the figures, only some of the bus bars 110, wires 108, and fingers 106 are labeled to minimize clutter on the figures.

In the example of FIG. 2, the back surface metallization pattern of the solar cell 120 includes a contact pad 116. The contact pad 116 may comprise the same material and formed the same way as the bus bars 110 and/or fingers 106. An electrically conductive adhesive (ECA) 118 connects the contact pad 116 of a solar cell 120 to the bus bar 110 of an adjacent solar cell 120 to create a series electrical connection between the solar cells 120.

Figure 3:
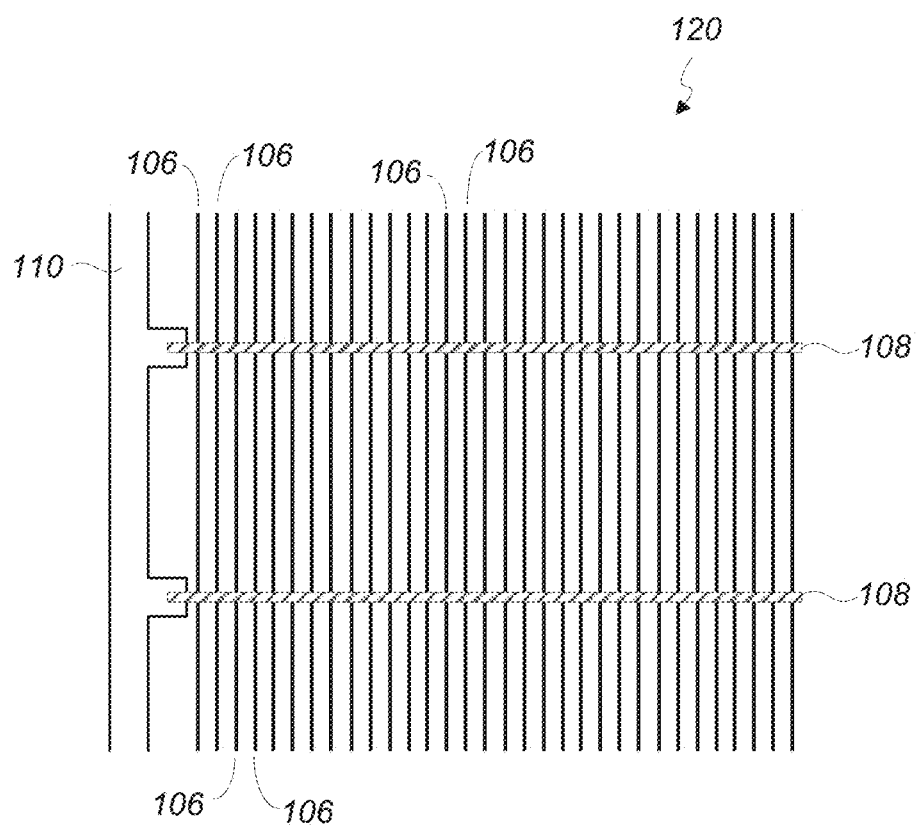
FIG. 3 shows an enlarged top portion of a solar cell in accordance with an embodiment of the present invention.

FIG. 3 shows an enlarged top portion of a solar cell 120 in accordance with an embodiment of the present invention. In the example of FIG. 3, the fingers 106 are disposed in parallel orientation to the bus bar 110, and the wires 108 are disposed in perpendicular orientation to the bus bar 110 and fingers 106. The bus bar 110, wires 108, and fingers 106 are electrically connected together, which in one embodiment are electrically connected to a semiconductor layer of n-type conductivity. As can be appreciated, the design of the bus bars 110, fingers 106, and wires 108 may be varied to suit different hypercell designs.

Figure 4:
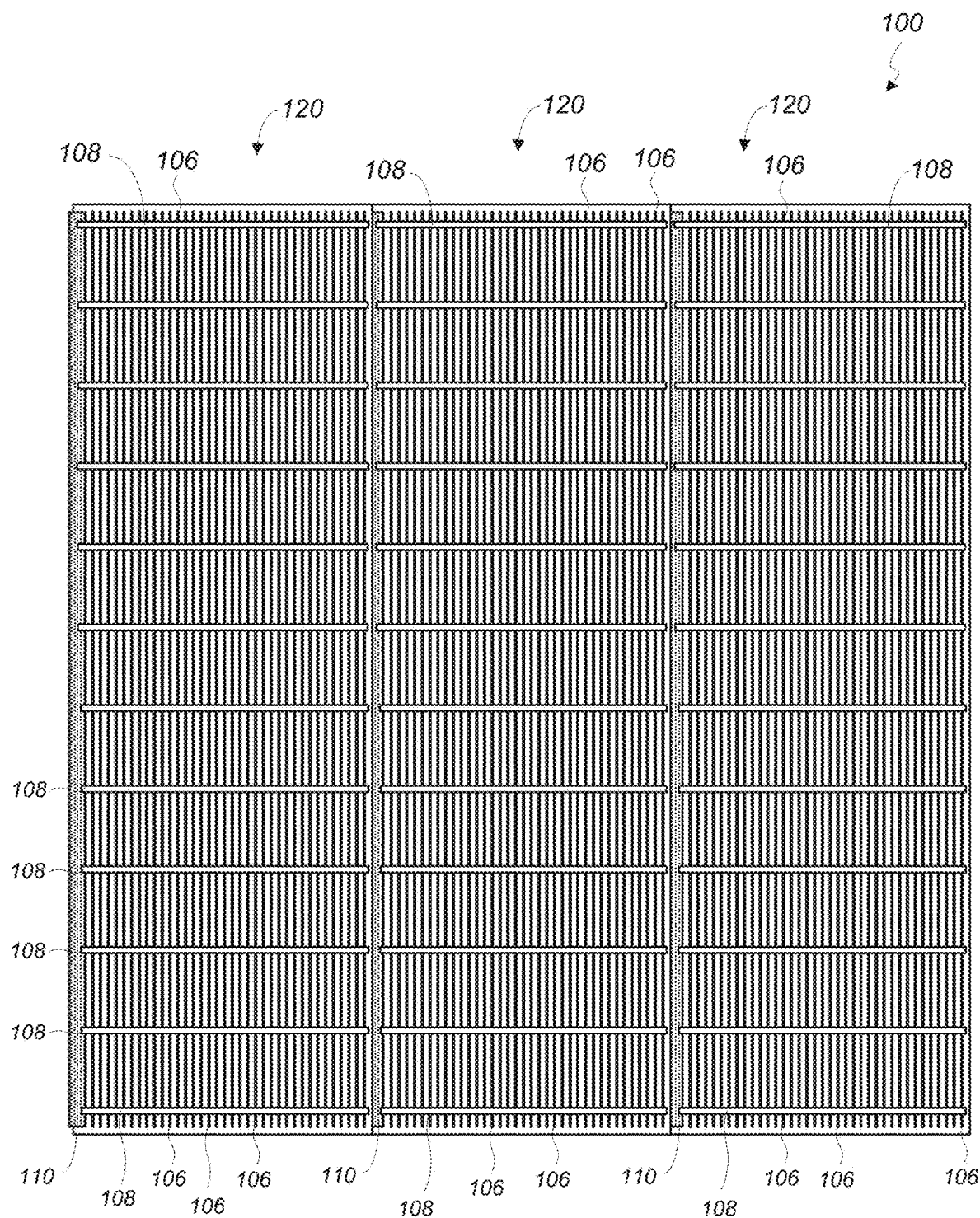
FIG. 4 shows a front view of a hypercell in accordance with an embodiment of the present invention.

FIG. 4 shows a front view of the hypercell 100 in accordance with an embodiment of the present invention. In the example of FIG. 4, the hypercell 100 is depicted as having three shingled solar cells 120 for illustration purposes only. As can be appreciated, the number of solar cells in a hypercell depends on the particulars of the hypercell. As illustrated in FIG. 4, each solar cell 120 has a plurality of wires 108, with each wire 108 having ends that terminate on the solar cell 120. The bus bars 110 and fingers 106 may be formed by printing or other deposition methods. In contrast, the wires 108 are individually pulled from a wire source, placed (as opposed to deposited) on the front sides of the solar cells 120, and then soldered to the fingers 106 and bus bars 110. Accordingly, attaching wires 108 to solar cells 120 can be a costly and time consuming operation.

Figure 5:
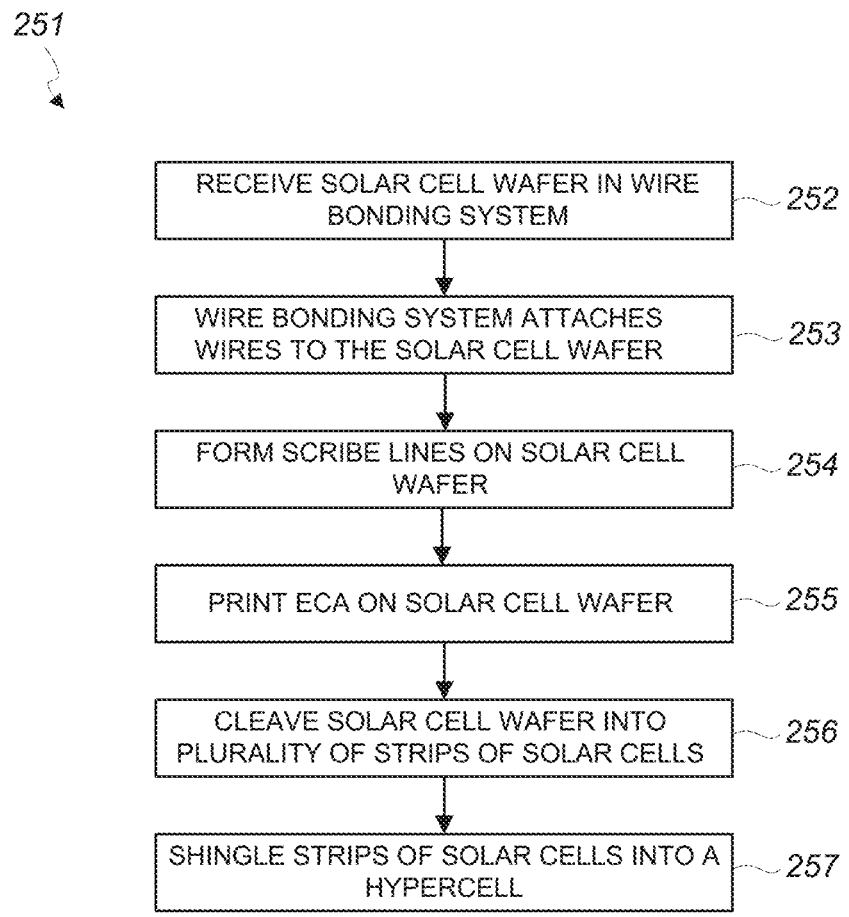
FIG. 5 shows a flow diagram of a method of fabricating a hypercell in accordance with an embodiment of the present invention.

FIG. 5 shows a flow diagram of a method 251 of fabricating a hypercell 100 in accordance with an embodiment of the present invention. In the example of FIG. 5, a solar cell wafer is received in a solar cell wafer wire bonding system (step 252). In one embodiment, the solar cell wafer, as received in the wire bonding system, already has bus bars, fingers, and a semiconductor diode structure. The wire bonding system attaches wires to the solar cell wafer (step 253) before the solar cell wafer is cleaved into individual strips of solar cells. The solar cell wafer is thereafter removed from the wire bonding system. In a laser system or other tool, scribe lines are formed on the solar cell wafer (step 254). The scribing step may be performed by scanning a laser beam on the solar cell wafer to form scribe lines thereon. The scribe lines facilitate cleaving of the solar cell wafer in a subsequent step to form individual strips of solar cells. ECA's are thereafter printed on contact pads of the solar cell wafer (step 255). The solar cell wafer is then cleaved along the scribe lines to yield strips of solar cells (step 256), which are then shingled into a hypercell (step 257). The shingled solar cells may be cured thereafter.

Figure 6:
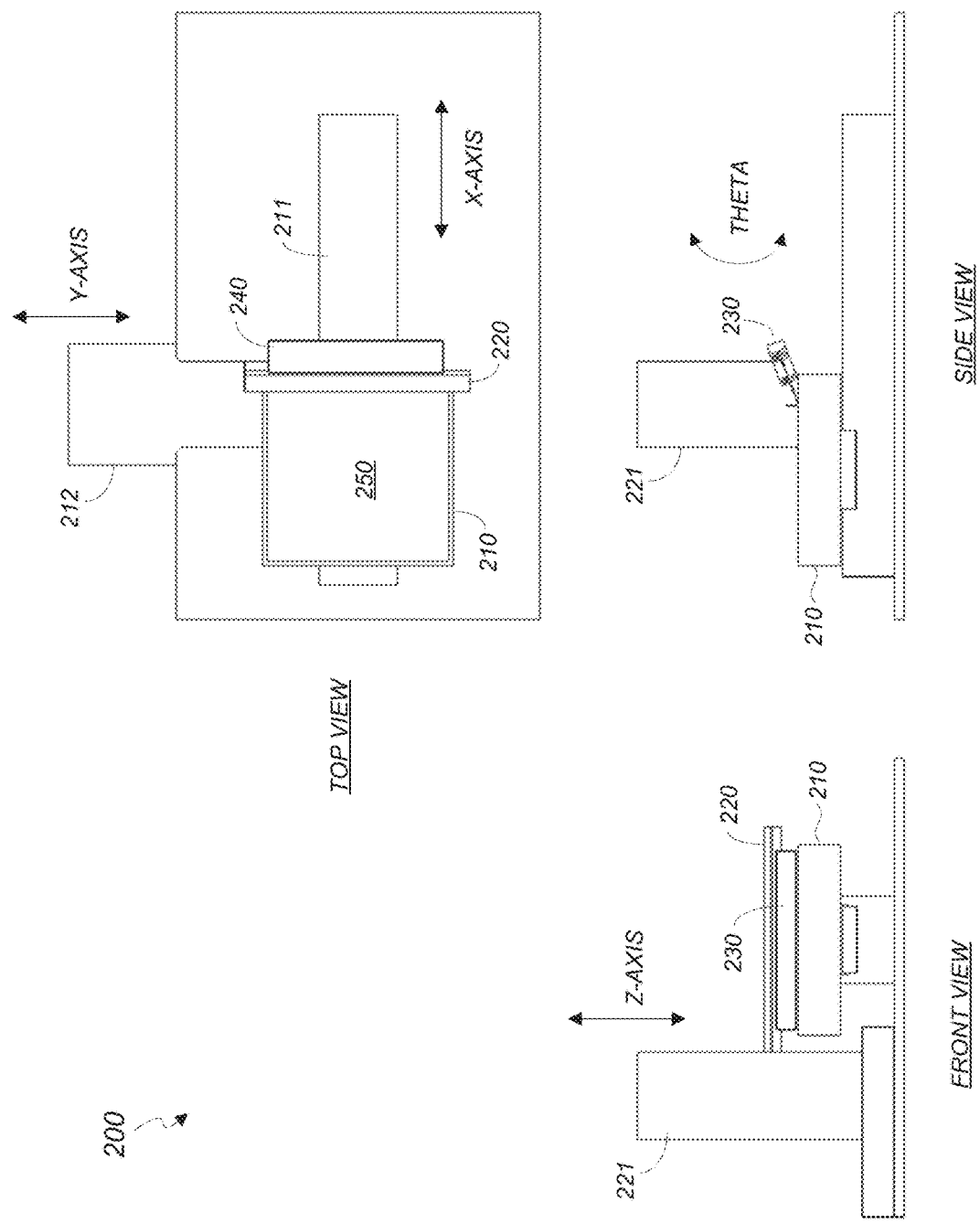
FIG. 6 shows a schematic diagram of a solar cell wafer wire bonding system in accordance with an embodiment of the present invention.

FIG. 6 shows a schematic diagram of a solar cell wafer wire bonding system 200 in accordance with an embodiment of the present invention. FIG. 6 shows a top view, a side view, and a front view of the wire bonding system 200. The wire bonding system 200 is configured to attach a plurality of wires 108 (e.g., see FIG. 3) on a solar cell wafer 250. The wires 108 are attached to the solar cell wafer 250 before the solar cell wafer 250 is cleaved into individual strips of solar cells 120.

The wire bonding system 200 includes a platform 210, which rides on an X-axis (front and back) translation stage 211 and a Y-axis (left and right) translation stage 212. Motors and guides of the translation stages are not shown for clarity of illustration. The solar cell wafer 250 is placed on the platform 210. Actuating the translation stages 211 and 212 moves the platform 210, and thus the solar cell wafer 250, along an X-Y plane that is parallel to the ground. This allows attachment of the wires 108 in-line or offset.

The wire bonding system 200 includes a wire feeder 240 that is configured to receive a plurality of wires 108 that are to be attached to the solar cell wafer 250. A wire bonding head assembly 230 can accommodate a plurality of lanes, with each lane being configured to place, solder, and cut a single wire 108 on the solar cell wafer 250.

The head assembly 230 and feeder 240 are mounted on a block 220, which is actuated by a pillar 221. Each end of the block 220 is coupled to a pillar 221, but only one pillar 221 is shown for clarity of illustration. The pillar 221 is configured to move the block 220 (and thus the head assembly 230 and feeder 240) along the Z-axis (up and down) and to rotate the block 220 (see theta) to change the angle of the head assembly 230 and feeder 240 relative to the plane of the solar cell wafer 250. The pillar 221 may comprise translational and rotational motors and corresponding guides (not shown).

Figure 7:
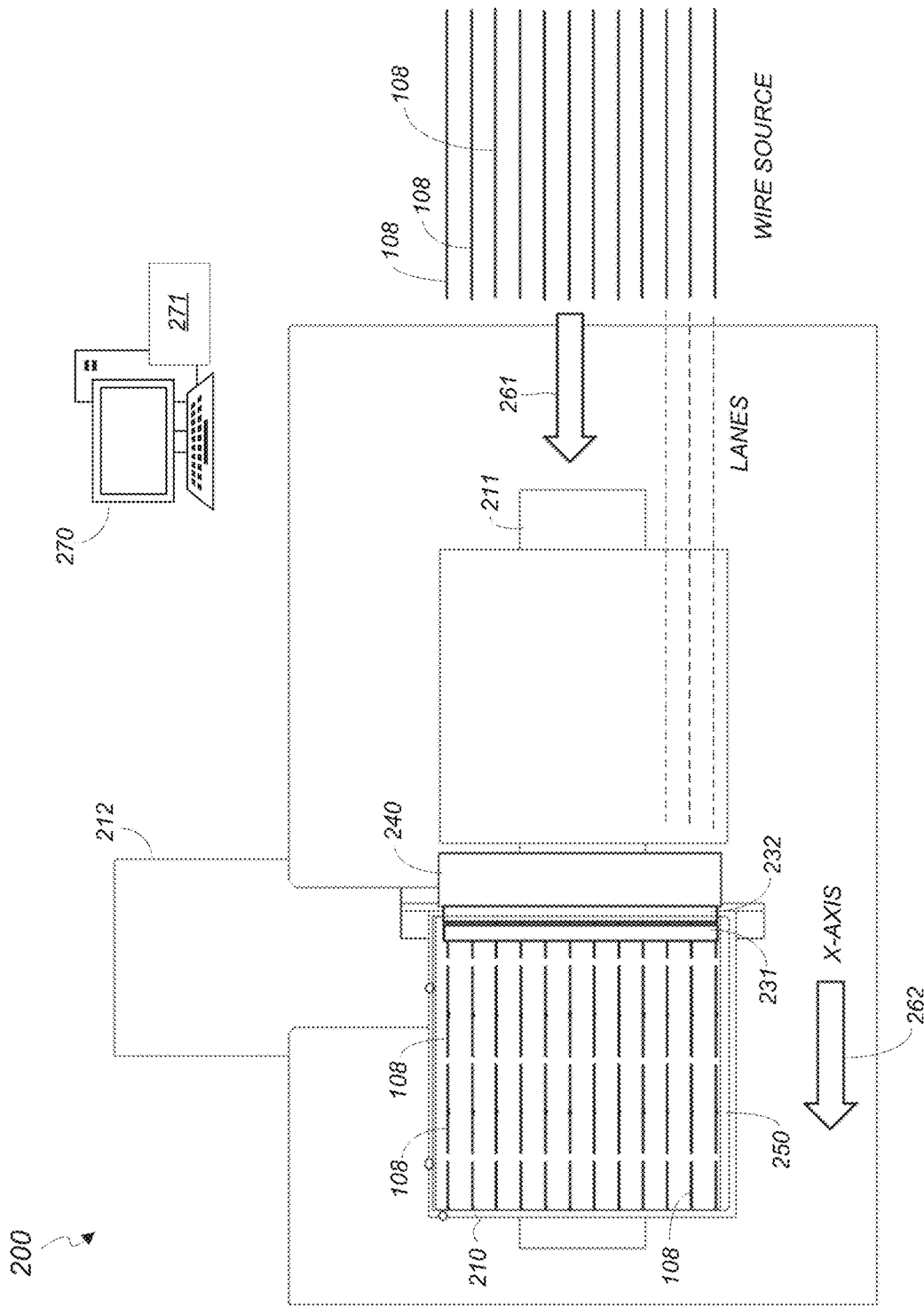
FIG. 7 shows a top view of a solar cell wafer wire bonding system in accordance with an embodiment of the present invention.

FIG. 7 shows a top view of the wire bonding system 200 in accordance with an embodiment of the present invention. The wire bonding system 200 includes a computer 270 that executes a control program 271 for controlling the operation of the wire bonding system 200. The computer 270 may include interface ports for communicating with motor controllers, transducers, sensors, and other control components of the wire bonding system 200. The computer 270 and the control components of the wire bonding system 200 may be implemented using suitable components that are commonly employed in the field of industrial control and automation.

As illustrated in FIG. 7, the wire bonding system 200 has a plurality of lanes for attaching a plurality of wires 108 on the solar cell wafer 250, which is supported by the platform 210. A wire source provides a plurality of wires 108, which are inserted in corresponding feed tubes (see FIG. 8, 304) of the wire feeder 240 (see arrow 261). In one embodiment, the wire source provides copper wires 108 that are coated with tin and lead. The wires 108 may be pulled through a clean flux solution (not shown) before being soldered to the solar cell wafer 250 in the wire bonding system 200.

Figure 8:
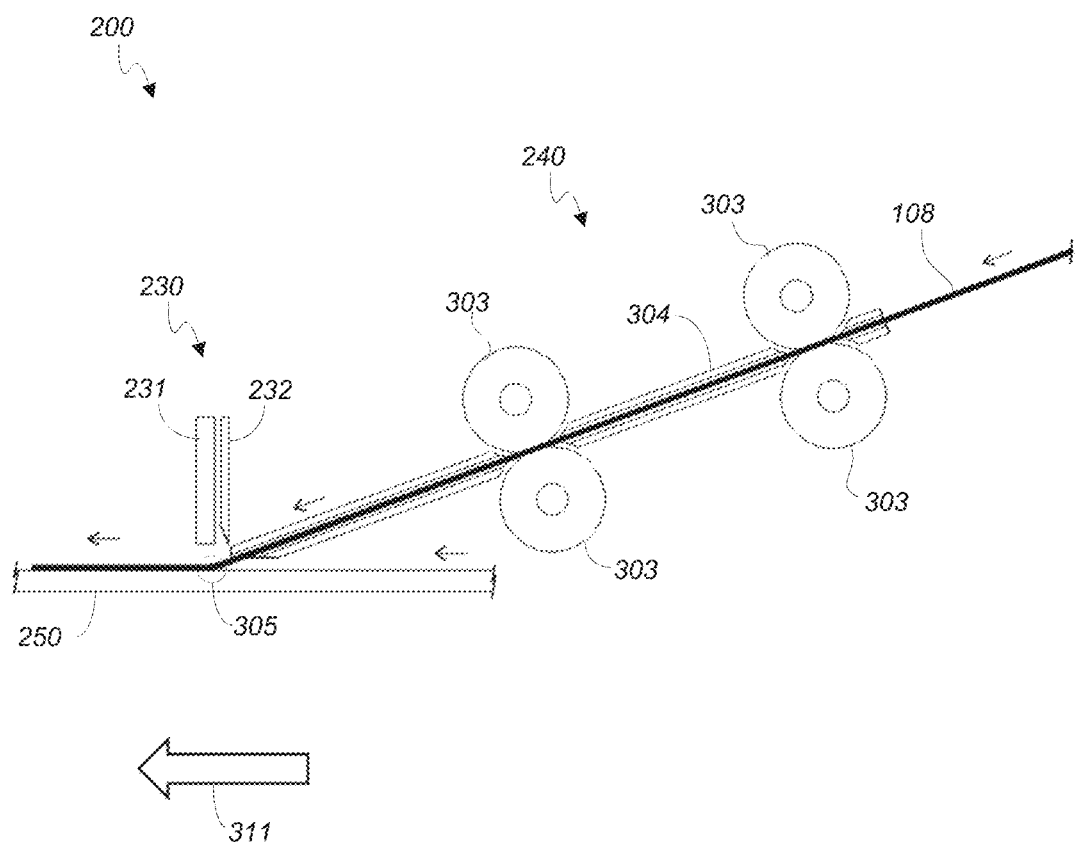
FIG. 8 shows an enlarged side view of a wire bonding head assembly and a wire feeder of a solar cell wafer wire bonding system in accordance with an embodiment of the present invention.
Figure 9:
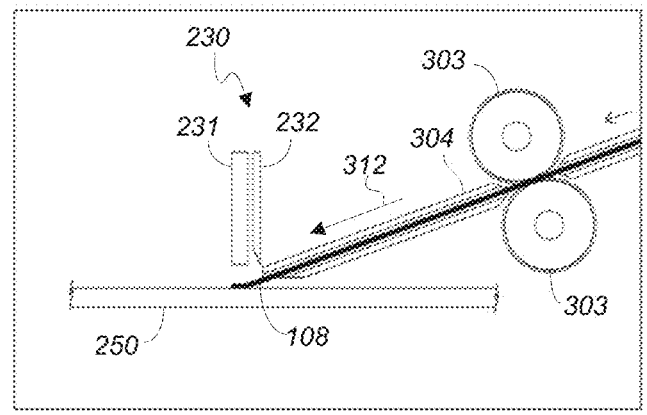
FIGS. 9-14 illustrate a method of attaching wires to a solar cell wafer in accordance with an embodiment of the present invention.

On each lane of the wire bonding system 200, a wire 108 is moved through the wire feeder 240 in the X-axis direction (see arrow 262), soldered by a corresponding heater tip 231 (see also FIG. 8, 231), and cut by a corresponding cutter 232 (see also FIG. 8, 232). In the example of FIG. 7, the cutter 232 is adjacent to the heater tip 231. The plurality of lanes allows a plurality of wires 108 to be attached to the solar cell wafer 250 at the same time in parallel operations, thereby increasing throughput. The wire bonding system 200 may be scaled to accommodate hypercell designs with fewer or more wires 108 and/or different solar cell wafer dimensions.

FIG. 8 shows an enlarged side view of a wire bonding head assembly 230 and a wire feeder 240 of the wire bonding system 200 in accordance with an embodiment of the present invention. FIG. 8 shows a single lane for attaching a wire 108 to the solar cell wafer 250. As previously noted, the wire bonding system 200 has multiple lanes for attaching multiple wires 108 at the same time in parallel operations.

In the example of FIG. 8, the wire feeder 240 comprises a feed tube 304 and a plurality of motorized rollers 303. In one embodiment, the feed tube 304 is heated and can accommodate a wire 108 that has a diameter ranging from 100 µm to 600 µm. The feed tube 304 may have an entry diameter that is larger than the diameter of the wire 108 to facilitate wire insertion, and an exit diameter that is slightly larger (e.g., about 5% larger) than the diameter of the wire 108. The feed tube 304 is at an angle relative to the solar cell wafer 250. The wire 108 comes from the wire source, enters the feed tube 304 on one end, and exits the feed tube 304 on an opposite end in the vicinity of the head assembly 230. The feed tube 304 has openings through which the rollers 303 contact the wire 108 in the feed tube 304. In the example of FIG. 8, a pair of opposing rollers 303 contact the wire 108 to facilitate movement of the wire 108 in the feed tube 304. The rollers 303 may be coupled to motors (not shown) with a brake system. The motors can be controlled to drive the rollers 303 to push or pull the wires 108 through the feed tube 304. Two pairs of opposing rollers 303 are shown for illustration purposes.

In the example of FIG. 8, an exit end of the feed tube 304 is below the head assembly 230 in the vicinity of an attachment point (see 305) where the wire 108 is soldered to the solar cell wafer 250. In one embodiment, the attachment point may be on a bus bar or a soldering pad. The head assembly 230 includes a soldering heater tip 231 and a cutter 232. At the attachment point, the heater tip 231 is heated (e.g., by pulse heating) to solder the wire 108 to the attachment point on the solar cell wafer 250. The soldering performed using the heater tip 231 may be an initial soldering step (also referred to as "first stage soldering") to align and tack the wire 108 on the solar cell wafer 250. The cutter 232 is configured to cut the wire 108 after soldering. The platform 210 (see FIG. 6) that supports the solar cell wafer 250 is moved forward (see arrow 311) to move the solar cell wafer 250 relative to the head assembly 230 and wire feeder 240 as needed.

A final soldering step (also referred to as "second stage soldering") may follow the initial soldering step. The final soldering step may solder the wire 108 to the solar cell wafer 250 along a length of the wire 108 that has not been soldered to the solar cell wafer 250 during the initial soldering step. The final soldering step may be performed, for example, by infrared soldering after the head assembly 230. The final soldering step may be performed in a heated chamber, such as an oven, for example. The final soldering step may also be performed in a dedicated soldering station that is integrated with or separate from the wire bonding system 200. The final soldering step may involve placing the solar cell wafer 250 on a heated platform, with the wires 108 facing away from the platform, and then pressing the wires 108 (e.g., using a rounded tip or metal roller) toward the platform. The solar cell wafer 250 may also be placed with the wires 108 facing a heated chuck, and then pressing down on the solar cell wafer 250 to make the wires 108 contact the chuck.

FIGS. 9-14 illustrate a method of attaching wires to a solar cell wafer in accordance with an embodiment of the present invention. The method is explained using components of the wire bonding system 200 for illustration purposes. As can be appreciated, the method may also be performed using other components without detracting from the merits of the present invention.

In the example of FIGS. 9-14, the steps of the method are performed sequentially. In a first step illustrated by FIG. 9, a wire 108 is fed through the feed tube 304 (see arrow 312). The rollers 303 facilitate at least the initial movement of the wire 108 in the feed tube 304. A first end of the wire 108 exits the feed tube 304 in the vicinity of the head assembly 230.

Figure 10:
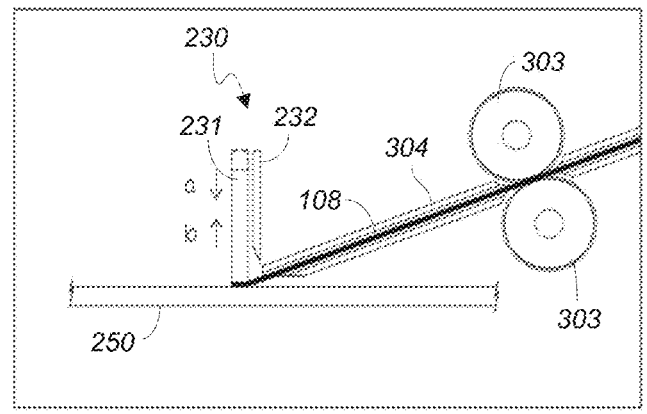

In a second step illustrated by FIG. 10, the heater tip 231 is lowered to contact and solder (e.g., by pulse heating) the first end of the wire 108 to a first attachment point on the solar cell wafer 250. The heater tip 231 is thereafter raised back to its neutral position.

Figure 11:
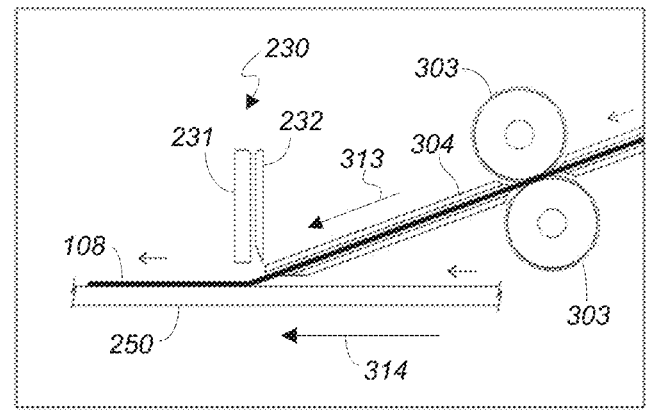

In a third step illustrated by FIG. 11, the wire 108 is moved through the feed tube 304 (see arrow 313) and the solar cell wafer 250 is indexed to move forward a predetermined distance (see arrow 314), thereby drawing a predetermined length of the wire 108 over the solar cell wafer 250. For example, the solar cell wafer 250 may be indexed to move a distance of 30 mm to 70 mm for six to two cuts on the solar cell wafer 250, with a cut providing a continuous wire 108. The total length of a wire 108 depends on the design of the hypercell. In the third step, the wire 108 is drawn primarily due to the movement of the solar cell wafer 250. As noted, the solar cell wafer 250 is supported on the platform 210, which is moved to move the solar cell wafer 250.

Figure 12:
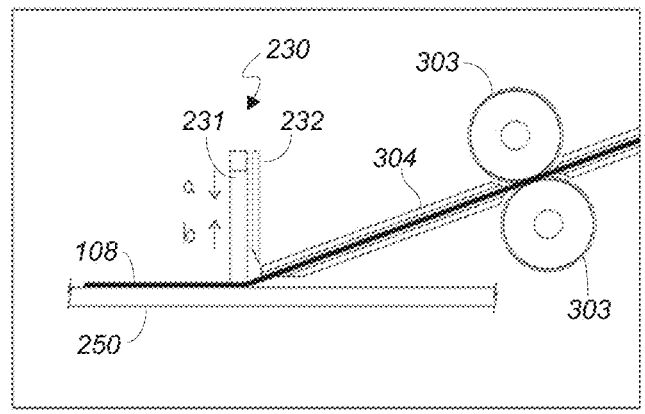

In a fourth step illustrated by FIG. 12, the heater tip is lowered to contact and solder the wire 108 to a second attachment point on the solar cell wafer 250. The heater tip 231 is thereafter raised back to its neutral position. In this example, the wire 108 is tack soldered to two attachment points, which are on opposing ends of a wire 108. As can be appreciated, the wire 108 may also be tack soldered to additional attachment points on the solar cell wafer, for example to a third attachment point between the first and second attachment points.

Figure 13:
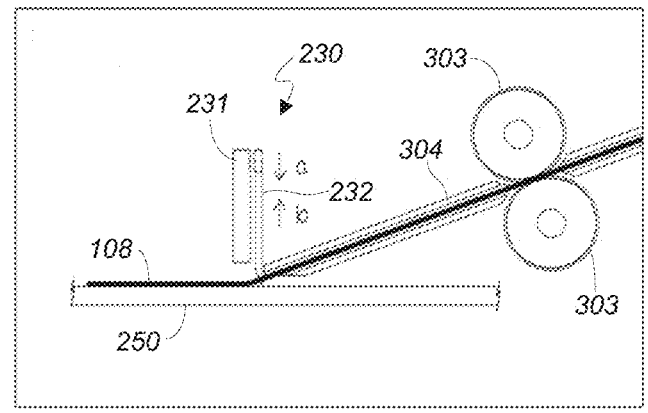

In a fifth step illustrated by FIG. 13, the cutter 232 is lowered to cut the wire 108, thereby forming a second end of the wire 108 at the second attachment point. The cutter 232 is thereafter raised back to its neutral position. At this time, the wire 108 has a predetermined total length with first and second ends that are soldered to the solar cell wafer 250.

Figure 14:
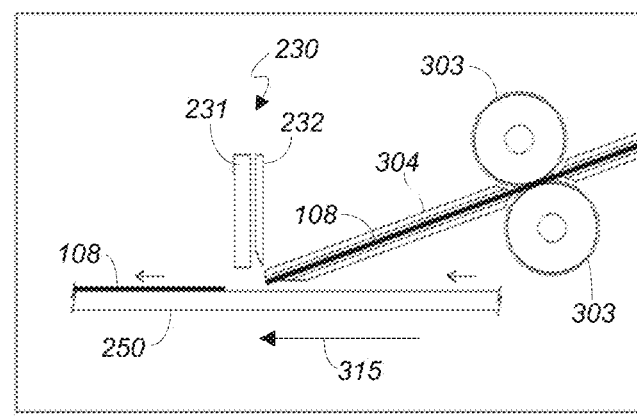

In a sixth step illustrated by FIG. 14, the solar cell wafer 250 is indexed to move forward a predetermined distance (see arrow 315), thereby creating a gap of predetermined gap length between the wire 108 and the next following wire 108. The number of gaps and the length of the gap depend on the design of the hypercell. For example, the wire bonding system 200 may create two gaps. A gap within a solar cell wafer may have a gap length of 0.5 mm to 3 mm, and a gap between solar cell wafers may have a gap length of 2 mm to 6 mm.

From the sixth step, the method proceeds back to the first step (see FIG. 9) to attach the next following wire 108 onto the solar cell wafer 250. As can be appreciated, the method is able to attach the wires 108 continuously and without wasting wire materials, thus minimizing material cost and attachment time.

Figure 15:
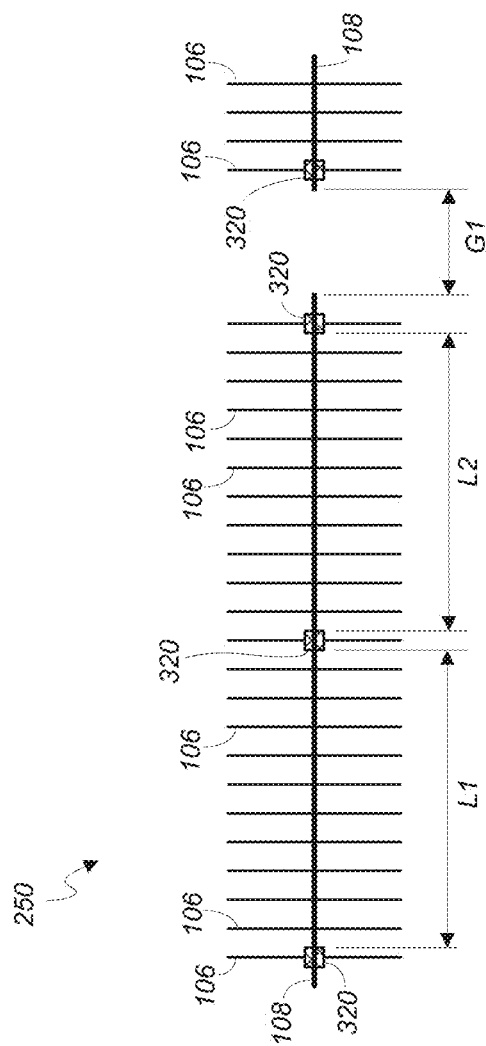
FIG. 15 shows wires that have been attached to a solar cell wafer in accordance with an embodiment of the present invention.

FIG. 15 shows wires 108 that have been attached to a solar cell wafer 250 in accordance with an embodiment of the present invention. Only two wires 108 are shown for clarity of illustration. In the example of FIG. 15, the wires 108 are perpendicular to the fingers 106. The wires 108 are soldered to attachment points 320 during initial soldering steps as illustrated in FIGS. 10 and 12. An attachment point 320 may be a bus bar or a soldering pad, for example. In the example of FIG. 15, the wire 108 is also soldered to an attachment point 320 in the middle portion of the wire 108. During a final soldering step, the lengths L1 and L2 of the wire 108 are soldered to the solar cell wafer 250. A gap G1 is created between the wire 108 and a following wire 108 when the solar cell wafer 250 is moved to pull the wire 108 after cutting as illustrated in FIG. 14.

Figure 16:
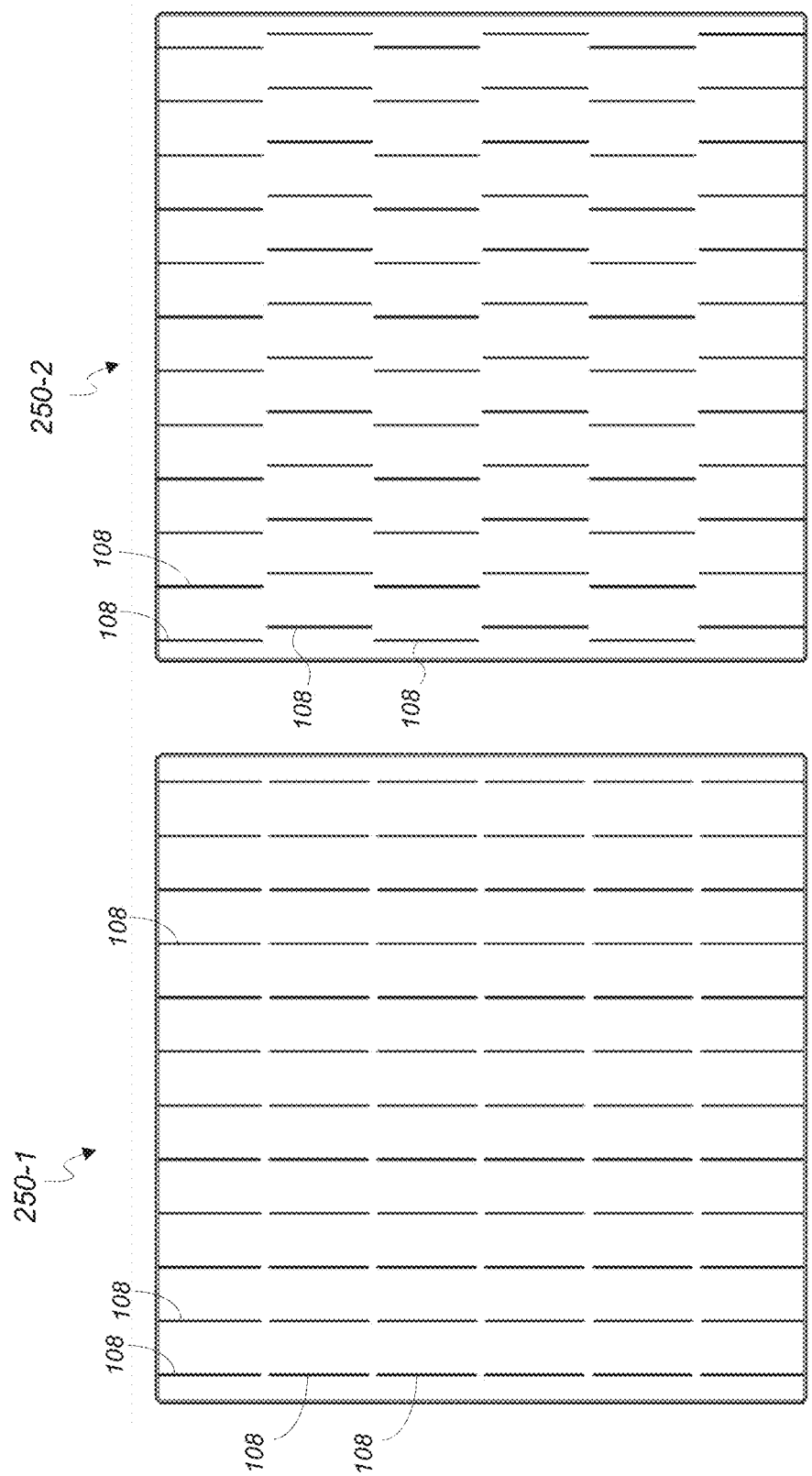
FIG. 16 shows solar cell wafers with in-line and offset wires in accordance with embodiments of the present invention.

The wires 108 may be attached along straight or offset lanes. FIG. 16 shows a solar cell wafer 250-1 where the wires 108 are attached along straight lanes. In the solar cell wafer 250-1, a wire 108 is in-line with the next following wire 108. FIG. 16 also shows a solar cell wafer 250-2 where the wires 108 are attached along offset lanes. In the solar cell wafer 250-2, a wire 108 and a next following wire 108 are offset. The wires 108 may be attached at offset lanes by moving the solar cell wafer 250 or the head assembly 230 and wire feeder 240 along the Y-axis as needed.

Figure 17:
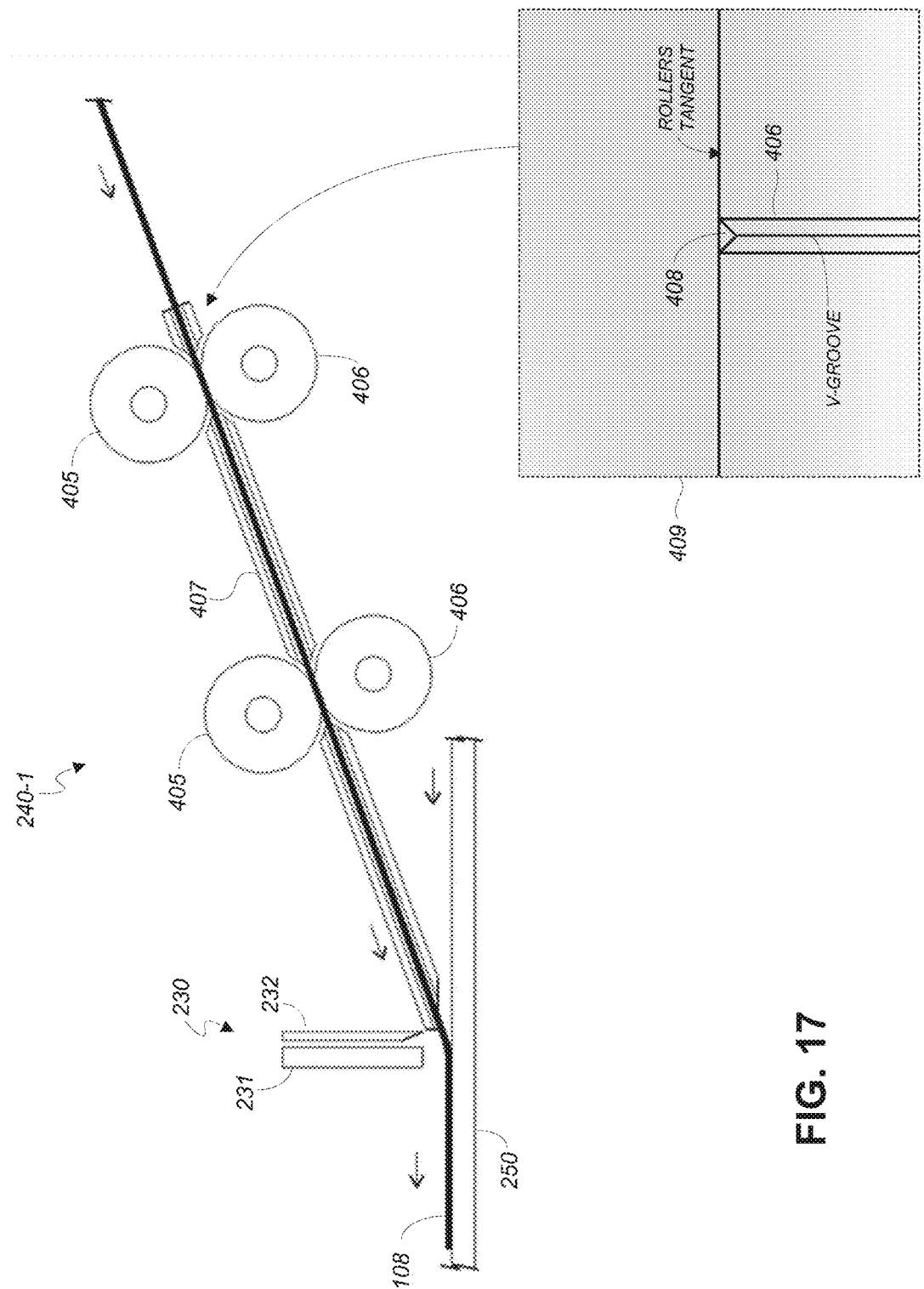
FIG. 17 shows an enlarged side view of a wire bonding head assembly and a wire feeder of a solar cell wafer wire bonding system in accordance with an embodiment of the present invention.

The wire bonding system 200 may be adapted to meet the needs of different hypercell designs. For example, the wire bonding system 200 may be adapted to accommodate different wire gauges. FIG. 17 shows an enlarged side view of a wire feeder 240-1 of the wire bonding system 200 in accordance with an embodiment of the present invention. The wire feeder 240-1 is an embodiment of the wire feeder 240 (see FIG. 8) that can accommodate thinner wires 108, e.g., 100 μm to 400 μm diameter.

In the example of FIG. 17, the feed tube 407 is a capillary tube that accepts a thin wire 108. As in the previously described feed tube 304, the feed tube 407 has openings through which motorized rollers 405 and 406 contact the wire 108 in the feed tube 407. In the example of FIG. 17, the rollers 405 are rubber rollers whereas the rollers 406 are grooved rollers. A pair of opposing roller 405 and roller 406 facilitate movement of the wire 108 through the feed tube 407. As shown in a zoom-in view 409 of FIG. 17, a roller 406 may have a V-shaped groove. The wire 108 goes through a space (see 408) between the roller 405 and the V-shaped groove of the roller 406, keeping the thin wire 108 in proper alignment.

Figure 18:
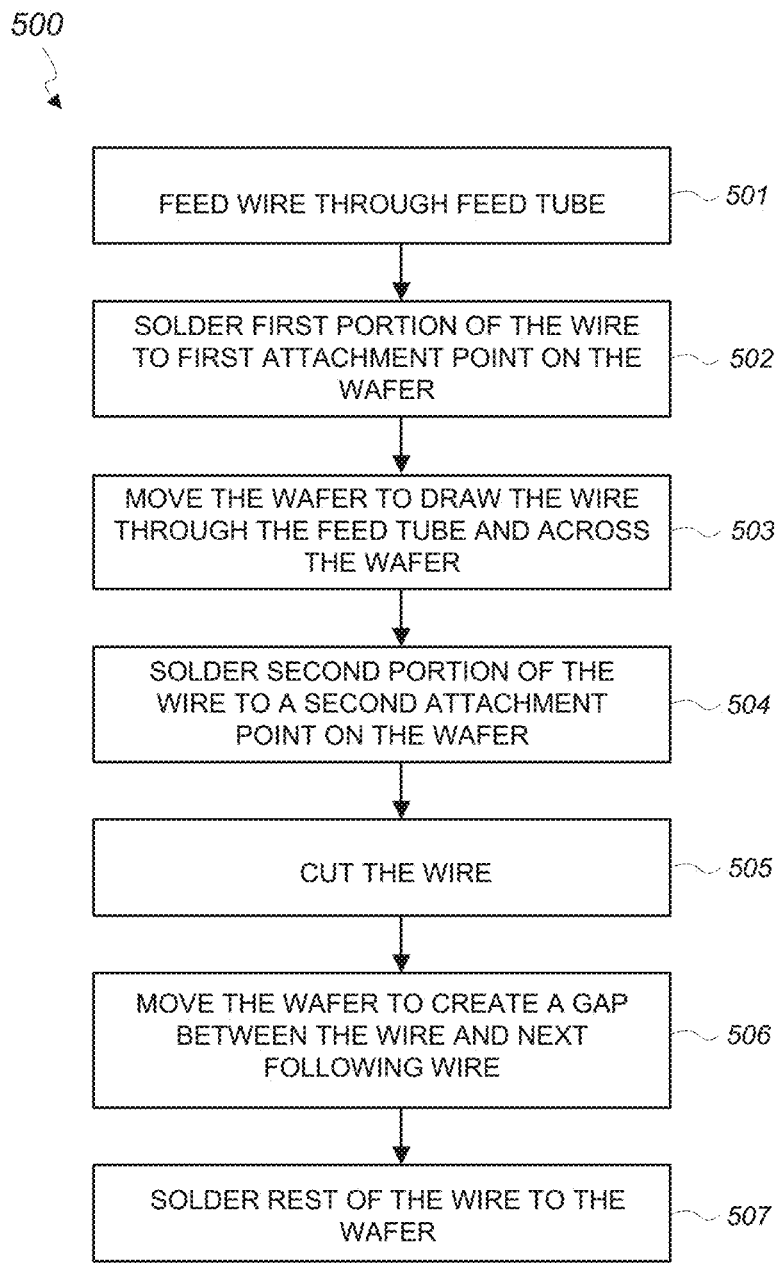
FIG. 18 shows a flow diagram of a method of attaching wires to a solar cell wafer in accordance with an embodiment of the present invention.

FIG. 18 shows a flow diagram of a method 500 of attaching wires to a solar cell wafer in accordance with an embodiment of the present invention. The method 500 may be performed using previously-described components. As can be appreciated, other components may also be employed without detracting from the merits of the present invention.

In the method 500, a wire is fed through a feed tube of a solar cell wafer wire bonding system (step 501). At an exit end of the feed tube, a first portion of the wire is soldered to a first attachment point on a solar cell wafer (step 502). The solar cell wafer is thereafter moved forward, thereby drawing the wire through the feed tube and across the wafer (step 503). A second portion of the wire, at the exit of the feed tube, is soldered to a second attachment point on the wafer (step 504). Generally, the wire may be soldered to a plurality of attachment points on the wafer, such as on two, three, etc. attachment points. The wire is thereafter cut to form a continuous length of the wire on the solar cell wafer (step 505). The solar cell wafer is then moved forward to create a gap between the wire and a next following wire to be attached to the solar cell wafer (step 506). The rest of the wire, such as portions of the wire that have not been soldered to attachment points, is then soldered to the solar cell wafer (step 507).

A solar cell wafer wire bonding system and a method of attaching wires to a solar cell wafer have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of attaching wires to a solar cell wafer, the method comprising:
    soldering a first portion of each of a first plurality of wires on a solar cell wafer;
    in a first instance, moving the solar cell wafer to draw the first plurality of wires across the solar cell wafer;
    after moving the solar cell wafer in the first instance, soldering a second portion of each of the first plurality of wires on the solar cell wafer;
    cutting each of the first plurality of wires; and
    in a second instance, moving the solar cell wafer to create a gap between the first plurality of wires and a second plurality of wires on the solar cell wafer.

2. The method of claim 1, further comprising:
    soldering the first plurality of wires on the solar cell wafer along a length of each of the first plurality wires.

3. The method of claim 1, wherein the first portion of each of the first plurality of wires is soldered on a corresponding attachment point on the solar cell wafer.

4. The method of claim 3, wherein the attachment point is a bus bar.

5. The method of claim 3, wherein the attachment point is a soldering pad.

6. The method of claim 1, wherein soldering the first portion of each of the first plurality of wires on the solar cell comprises:
    drawing each of the first plurality of wires through a corresponding feed tube of a plurality of feed tubes; and soldering the first portion of each of the first plurality of wires at an exit end of the corresponding feed tube of the plurality of feed tubes.

7. The method of claim 6, wherein cutting each of the first plurality of wires comprises:

cutting each of the first plurality of wires at the exit end of the corresponding feed tube of the plurality of feed tubes.

\* \* \* \* \*